(12) United States Patent
Ecker et al.

(10) Patent No.: US 9,568,531 B2
(45) Date of Patent: Feb. 14, 2017

(54) DEVICE FOR DETECTING FAULT IN AN ELECTRIC LINE

(71) Applicant: Lisa Dräxlmaier GmbH, Vilsbiburg (DE)

(72) Inventors: Stefan Ecker, Vilsbiburg (DE); Jan Marquardt, Landshut (DE); Michael Wortberg, Dorfen (DE); Matthias Stemplinger, Hauzenberg (DE); Yves Müller, Dorfen (DE)

(73) Assignee: LISA DRÄXLMAIER GMBH, Vilsbiburg (DE)

( * ) Notice: Subject to any disclaimer, the term of this patent is extended or adjusted under 35 U.S.C. 154(b) by 97 days.

(21) Appl. No.: 14/263,073

(22) Filed: Apr. 28, 2014

(65) Prior Publication Data

US 2014/0320149 A1    Oct. 30, 2014

(30) Foreign Application Priority Data

Apr. 29, 2013 (DE) .......................... 10 2013 207 775

(51) Int. Cl.
*G01R 31/02* (2006.01)
*G01R 31/00* (2006.01)
*G01R 31/12* (2006.01)

(52) U.S. Cl.
CPC ........... *G01R 31/024* (2013.01); *G01R 31/007* (2013.01); *G01R 31/1227* (2013.01)

(58) Field of Classification Search
CPC . G01R 31/024; G01R 31/007; G01R 31/1227; G01R 31/02; G01R 31/025; G01R 31/026; G01R 31/08; G01R 31/081; G01R 31/083; G01R 31/085; G01R 31/086; G01R 31/00; G01R 31/008; G01R 31/1272; G01R 31/28; G01R 31/333; G01R 15/12; G01R 15/144; G01R 27/00; G01R 23/20; H02H 1/0015; H02H 1/0023; H02H 3/006; H02H 3/30; H04B 10/697; G08C 15/04; H04N 7/045

(Continued)

(56) References Cited

U.S. PATENT DOCUMENTS

| | | | | |
|---|---|---|---|---|
| 4,475,079 A | * | 10/1984 | Gale | ...................... G01R 31/11 324/533 |
| 5,432,455 A | * | 7/1995 | Blades | ................. G01R 31/021 324/520 |

(Continued)

FOREIGN PATENT DOCUMENTS

| | | |
|---|---|---|
| DE | 100 33 687 A1 | 3/2001 |
| DE | 10 2004 051 734 A1 | 7/2005 |

(Continued)

*Primary Examiner* — Huy Q Phan
*Assistant Examiner* — David Frederiksen
(74) *Attorney, Agent, or Firm* — Finnegan, Henderson, Farabow, Garrett & Dunner LLP

(57) ABSTRACT

A device for detecting faults in an electric line between a voltage source and a load is disclosed. The device includes a signal-generation unit a signal-receiving unit and an evaluation mechanism. The signal-generation unit is configured to produce a power-line signal and transmit the power-line signal via the electric line to an external mechanism. The signal-receiving unit is configured to receive a response signal from the external mechanism. The evaluation mechanism is configured to detect an occurrence of a fault, when the signal-receiving unit fails to receive a response signal.

5 Claims, 2 Drawing Sheets

(58) Field of Classification Search
USPC ....... 324/503, 512, 522, 523, 532–535, 537, 324/541, 551, 555, 557
See application file for complete search history.

(56) References Cited

U.S. PATENT DOCUMENTS

| | | | | |
|---|---|---|---|---|
| 5,590,012 A | * | 12/1996 | Dollar, II | H02H 1/0015 324/536 |
| 5,729,145 A | * | 3/1998 | Blades | G01R 31/1272 324/522 |
| 5,805,397 A | * | 9/1998 | MacKenzie | G01R 31/025 361/42 |
| 6,477,021 B1 | * | 11/2002 | Haun | H01H 71/125 324/520 |
| 6,772,077 B1 | * | 8/2004 | Parker | G01R 31/12 361/63 |
| 6,809,483 B2 | * | 10/2004 | Alexandrov | H05B 41/2813 315/224 |
| 7,834,637 B2 | * | 11/2010 | Kojori | H02H 1/0015 324/522 |
| 2009/0180233 A1 | * | 7/2009 | Maity | H02H 1/0023 361/113 |
| 2010/0060468 A1 | * | 3/2010 | Elms | G01R 31/3272 340/638 |
| 2010/0085058 A1 | * | 4/2010 | Gallagher | B61L 15/0036 324/503 |
| 2010/0215358 A1 | * | 8/2010 | Harres | G01R 31/1227 398/17 |
| 2011/0115511 A1 | * | 5/2011 | Finlay, Sr. | H01H 83/04 324/750.3 |
| 2012/0063045 A1 | * | 3/2012 | Shearon | H02H 3/08 361/65 |
| 2012/0119918 A1 | * | 5/2012 | Williams | H02H 3/335 340/664 |
| 2012/0161778 A1 | * | 6/2012 | Fernandez Banares | G01R 31/025 324/503 |
| 2013/0006560 A1 | * | 1/2013 | Cern | G01R 31/1272 702/66 |
| 2014/0009856 A1 | * | 1/2014 | Ward | H02H 3/162 361/42 |
| 2014/0192451 A1 | * | 7/2014 | Locker | H02H 1/0023 361/103 |

FOREIGN PATENT DOCUMENTS

| | | | |
|---|---|---|---|
| DE | 10 2009 058 877 A1 | 6/2011 | |
| DE | 10 2011 107 629 A1 | 1/2013 | |
| EP | 2 040 348 A2 | 3/2009 | |
| WO | WO 2012131508 A1 * | 10/2012 | ............. H02H 3/162 |

\* cited by examiner

DEVICE FOR DETECTING FAULT IN AN ELECTRIC LINE

CROSS-REFERENCE TO RELATED APPLICATIONS

This application is based upon and claims the benefit of prior German Application No. 10 2013 207 775.0, filed on Apr. 29, 2013, the entire contents of which are incorporated herein by reference.

FIELD OF TECHNOLOGY

The disclosure relates to an automotive device for detecting a fault in an electric line and, more particularly, to a device for detecting arcs in an electric line in a vehicle.

BACKGROUND

The number of items consuming electricity in modern vehicles, as well as their power consumption, is steadily rising. For this reason, it has been contemplated to equip vehicles with a 48V wiring system capable of supplying different electrical equipment (loads) in the vehicle with greater power at a constant amperage. Using 48V, however, creates a problem if an accidental short-circuit occurs, as stable arcs may develop, because 48V exceeds the arc ignition voltage.

Conventionally, electric lines are protected by fuses. However, since an arc represents an additional resistance in the line, the short-circuit current is limited such that the fuse may not be triggered.

Generally, a distinction is made between two types of arcs, i.e., serial and parallel arcs, which will be explained in more detail below.

FIG. 1 shows an example of a parallel arc, and particularly a circuit configuration with a 48V power source, as well as an amperage waveform over time. Parallel arcs appear parallel to the load. These are caused, e.g., by defective cable insulation, causing a short-circuit to occur toward the auto body or the existing 12V electric wiring system. With a parallel arc, the current has a series of spikes of several hundred amperes. However, since the spikes may be short-lived, an average current is often not enough to blow a fuse.

FIG. 2 shows an example of a serial arc, and particularly a circuit configuration with a 48V power source, as well as an amperage waveform over time. Serial arcs occur in series toward the load. They are caused, e.g., by a broken cable or damaged plug connections. Serial arcs act like an additional resistance in the electric circuit, thereby reducing the amperage relative to the intact state of the electric circuit. A serial arc therefore limits the load current, such that a fuse will not blow.

Both serial and parallel arcs produce very high temperatures, whereby a stable arc may greatly damage the vehicle. It is therefore desirable that a developing arc be detected at an early stage. It is, however, very difficult to tell the difference between a power limitation caused by a serial arc and fluctuations in the power consumption caused by the load.

Some conventional methods for the detection of arcs are known. Since an arc generates frequency components in the kilohertz range, attempts were made to detect the arc by evaluating the amperage- or voltage-frequency range (e.g., using a fast Fourier transform). Such a method is described, e.g., in EP 2040348 A2. However, depending on the load, it remains difficult to distinguish clearly between normal signal components and signal components caused by arcs. Moreover, such a method requires complex and expensive hardware comprising a signal processor. Optical arc detection, in which an arc is detected by an optical fiber surrounding a cable, represents another known method (see, e.g., DE 10 2004 051 734 A1). All these methods, however, have the disadvantage of relatively complex implementation and/or unreliable detection of the arc.

SUMMARY

One object of the disclosure is to provide a simple and reliable device for detecting faults in an automotive electric line. This object is achieved by a device as disclosed herein.

A device consistent with embodiments of the disclosure for detecting a fault in an electric line between a voltage source and a load in a vehicle includes a signal-generation unit configured to generate a power-line signal and transmit this power-line signal via the electric line to an external mechanism, a signal-receiving unit configured to receive a response signal from the external mechanism, and an evaluation unit configured to detect the occurrence of a fault, when the signal-receiving unit does not receive a response signal from the external mechanism.

The device consistent with embodiments of the disclosure uses a power-line signal to detect a fault. Power-line communication is used to transfer signals from a controller to a load-control device via an electric supply line. An arc occurring in the supply line, however, would prevent the power-line signal from being correctly transmitted, and thus the arc can be detected. That is, the device can detect the occurrence of a fault in power-line, as communication is no longer possible. In particular, this idea may be implemented at no extra cost in an existing power-line communication system.

According to an embodiment, the signal-generation unit transmits an intermittent power-line signal to the external mechanism. Thus, the occurrence of a fault can be quickly detected.

According to a further embodiment, a switch is provided on the line, and the evaluation mechanism opens this switch when detecting a fault. The malfunctioning device in the electric line may thus quickly be de-energized in order to prevent a stable arc from developing.

According to a further embodiment of the disclosure, the voltage source has a voltage supply with a voltage greater than an arc ignition voltage.

Below, the device consistent with embodiments of the disclosure is described in detail with reference to the accompanying drawings.

DESCRIPTION OF EMBODIMENTS

Below follows a detailed description of embodiments of the disclosure with reference to FIG. 3. This description contains examples that these should not be construed as restrictive of the disclosed embodiments.

Figure 1:
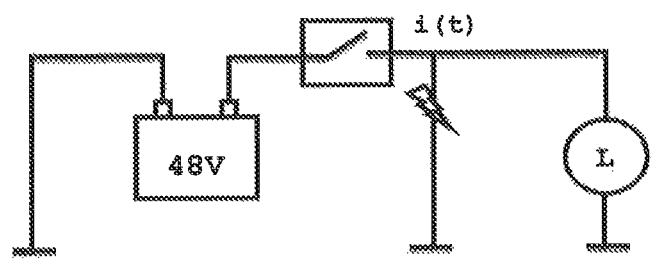
FIG. 1 schematically shows a circuit in the presence of a parallel arc and an associated amperage waveform over time.
Figure 1:
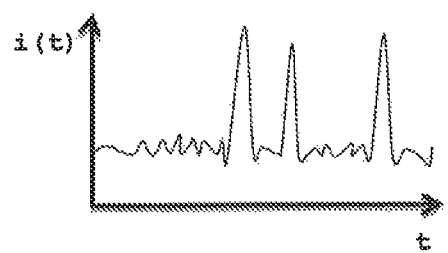
Figure 2:
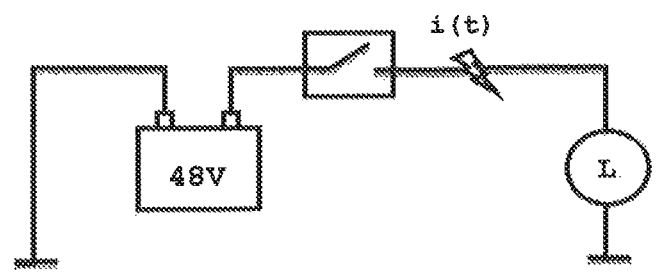
FIG. 2 schematically shows a circuit in the presence of a serial arc and an associated amperage waveform over time.
Figure 2:
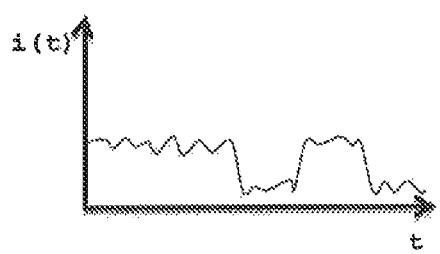
Figure 3:
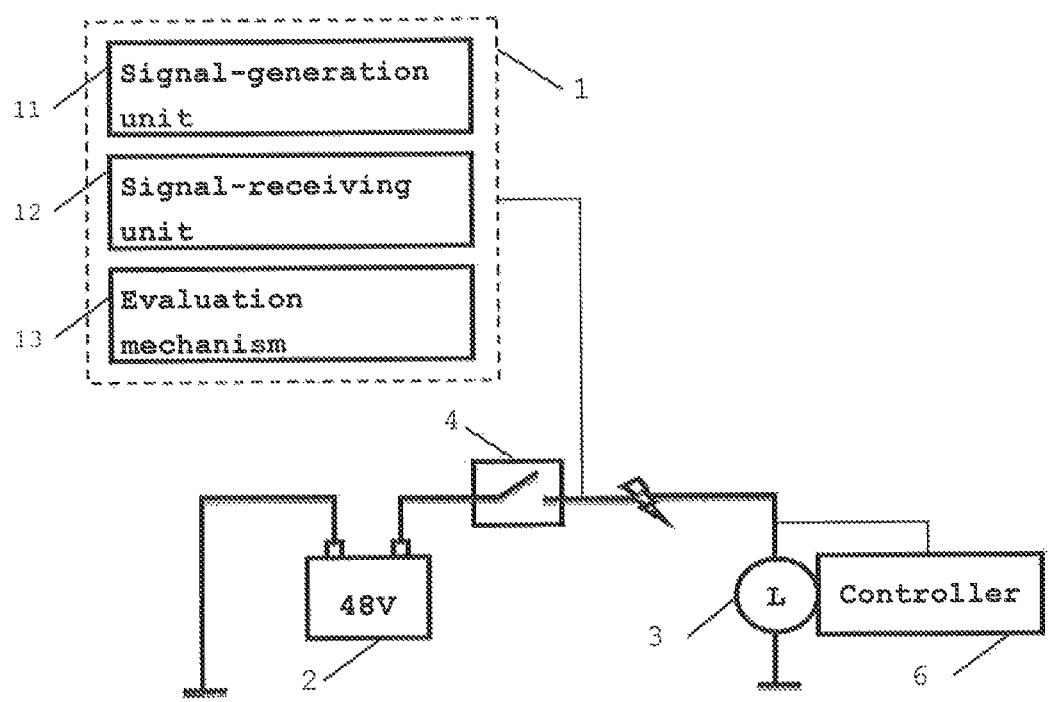
FIG. 3 shows a device for detecting a fault in an electric line by means of power-line communication according to an exemplary embodiment of the disclosure.

FIG. 3 shows an exemplary device consistent with embodiments of the disclosure for detecting a fault in an electric line between a voltage source 2 and a load 3 in a vehicle.

In FIG. 3, the voltage source 2 is designed as a 48V power source. Furthermore, a switch 4 is arranged between the voltage source 2 and the load 3. The load 3 is controlled by a controller 6, which receives control signals via the electric line from a device 1. The device 1 includes a signal-generation unit 11, a signal-receiving unit 12, and an evaluation mechanism 13.

The signal-generation unit 11 is configured to produce a power-line signal and transmit the power-line signal via the electric line to the controller 6. In addition, existing power lines are used for transmitting data during power-line communication. The signals are thereby additionally modulated to one or more carrier frequencies on the line. This may involve analog or digital signals.

The signal-receiving unit 12 is configured to receive a response signal from the controller 6. In some embodiments, the signal-generation unit 11 emits an intermittent ping or a similar signal in order to control the load 3. The evaluation mechanism 13 is configured to detect the occurrence of a fault, if the signal-receiving unit 12 does not receive a response signal from the controller 6. In other words, the evaluation mechanism 13 detects the occurrence of a fault, if a valid signal is not returned.

In particular, power-line communication between the device 1 and the controller 6 is interrupted by the occurrence of an arc on the electric line. The modulated power-line signals can no longer be transmitted due to the arc. Thus, the device 1 is able to detect the occurrence of a serial arc, as a serial arc instantly causes the modulated signal sequence in the supply line to be interrupted. The signal-generation unit 11 and the signal-receiving unit 12 may thereby form a domain controller.

In a modification of the embodiment shown in FIG. 3, the power-line signals transmitted by the device 1 to controller 6 may serve only to detect a fault. In other words, the power-line signals do not contain any information of relevance for controlling the load. Their sole purpose is to detect an arc. Controlling the load 3 may, furthermore, be done via dedicated CAN lines. In this case, chirp signals with a large bandwidth may be used for arc recognition.

Above, the device consistent with embodiments of the disclosure has been described as a component of the automotive wiring system, in particular of an automobile. However, one of ordinary skill in the art would understand that the device consistent with embodiments of the disclosure may also be applied to another electric power network, in which the voltage and/or wattage is high enough for an arc to occur.

In particular, those skilled in the art will recognize that different modifications and variations of the device and the method of the disclosure may be implemented without exceeding the scope of the disclosure.

Moreover, the disclosure has been described with reference to certain examples, which are merely provided to improve the understanding of the disclosure and not to limit its scope. Moreover, those skilled in the art would recognize that the disclosure may be implemented by combining many different combinations of the elements. Thus, the scope of the invention is indicated by the following claims.

What is claimed is:

1. An automotive device for detecting arcs in an automotive electric line between a voltage source and a load in a vehicle, comprising:
   a signal-generation unit configured to produce a power-line signal modulated to one or more carrier frequencies on the automotive electric line and transmit the power-line signal via the automotive electric line to an external controller configured to control the load in the vehicle;
   a signal-receiving unit configured to receive a response signal from the external controller; and
   an evaluation mechanism configured to detect an occurrence of an arc, when the signal-receiving unit fails to receive the response signal.

2. The device according to claim 1, wherein the power-line signal includes an intermittent power-line signal.

3. The device according to claim 1, wherein the evaluation mechanism is further configured to open a switch provided on the electric line, when the occurrence of the arc is detected.

4. The device according to claim 1, wherein the voltage source has a supply voltage greater than an arc-ignition voltage.

5. The device according to claim 1, wherein the power-line signal includes a chirp signal.

* * * * *